United States Patent
Stribley et al.

(10) Patent No.: US 6,815,264 B2
(45) Date of Patent: Nov. 9, 2004

(54) ANTIFUSES

(75) Inventors: Paul Ronald Stribley, Plymouth (GB); John N Ellis, Plymouth (GB); Ian G Daniels, Plymouth (GB)

(73) Assignee: Zarlink Semiconductor Limited (GB)

( * ) Notice: Subject to any disclaimer, the term of this patent is extended or adjusted under 35 U.S.C. 154(b) by 0 days.

(21) Appl. No.: 10/299,133

(22) Filed: Nov. 19, 2002

(65) Prior Publication Data

US 2003/0094671 A1 May 22, 2003

(30) Foreign Application Priority Data

Nov. 20, 2001 (GB) .............................................. 0127696

(51) Int. Cl.$^7$ .............................................. H01L 29/00
(52) U.S. Cl. .................... 438/131; 438/128; 438/600; 438/601; 438/630; 257/530; 257/528; 257/50; 257/209; 257/752; 257/754
(58) Field of Search ................................ 438/131, 128, 438/600, 601, 630; 257/530, 528, 50, 209, 752, 754

(56) References Cited

U.S. PATENT DOCUMENTS

| 5,311,039 A | | 5/1994 | Kimura et al. | |
|---|---|---|---|---|
| 5,844,297 A | | 12/1998 | Crafts et al. | |
| 5,847,441 A | | 12/1998 | Cutter et al. | |
| 5,905,670 A | * | 5/1999 | Babson et al. | 365/105 |
| 6,258,700 B1 | * | 7/2001 | Bohr et al. | 438/467 |

FOREIGN PATENT DOCUMENTS

WO  WO 01/69658 A2  6/2001

\* cited by examiner

*Primary Examiner*—Minhloan Tran
*Assistant Examiner*—Remmon R. Fordé
(74) *Attorney, Agent, or Firm*—Thompson Hine LLP

(57) ABSTRACT

A method of producing an antifuse, comprises the steps of:
  depositing a layer of undoped or lightly doped polysilicon on a layer of silicon dioxide on a semiconductor wafer;
  doping one region of the polysilicon P+;
  doping another region of the polysilicon N+,
  leaving an undoped or lightly doped region between the P+ and N+ regions; and
  forming electrical connections to the P+ and N+ regions.

18 Claims, 1 Drawing Sheet

ANTIFUSES

TECHNICAL FIELD

The invention relates to antifuses, and methods of producing antifuses.

BACKGROUND

Antifuses are useful devices, which may be used in circuits to program data or to trim/correct the circuit to remove unwanted offsets. A common antifuse component is a parallel plate capacitor which is insulating before fusing and conducting after. These components may need to be large due to the area of the capacitor used as a fuse. Extra processing steps may be required to fabricate the capacitor which are not otherwise needed to make the other circuit components. This increases cost and complexity. It is better to reuse layers on an existing process sequence to manufacture the fuses.

The insulating material may be an oxide or undoped polysilicon layer (see U.S. Pat. No. 5,844,297: Antifuse device for use on a field programmable interconnect chip. Crafts et al.) when making a vertical antifuse structure.

In the past a conventional fusing element was used on chip, by making a very narrow piece of metal or polysilicon conductor which is melted or vaporised by a high electric current. The action of fusing causes the passivation layers, which protect the chip from moisture, to be compromised. Also the fuse residue tends to be distributed over the surface of the chip. Very high current levels are needed to melt and vaporise the fuse material. The method is unsatisfactory for integrated circuit use.

Another possibility is to use a junction diode in the single crystal silicon substrate (see U.S. Pat. No. 5,847,441: Semiconductor junction antifuse circuit. D J. Cutter, K D. Beigel, Micron Technology, Inc.). The diode may be 'blown' by applying a large reverse current, so that it becomes a short circuit. A drawback of this method is the need to isolate the fuse junctions from the conducting substrate by placing the device in a well of opposite doping type to substrate. Another disadvantage is the high current required to cause doping redistribution in the fuse; the silicon is a good conductor of heat and diffusion is slow in a single crystal.

Dopant diffusion is fast for polysilicon due to movement through the grain boundaries. Thus the currents required to fail a polysilicon antifuse are much lower than a single crystal device.

SUMMARY

According to the invention there is provided an antifuse and a method of producing antifuses, as set out in the accompanying claims.

BRIEF DESCRIPTION OF THE DRAWINGS

An embodiment of the invention will now be described, by way of example only, with reference to the accompanying drawings, in which.

DETAILED DESCRIPTION

Figure 1:
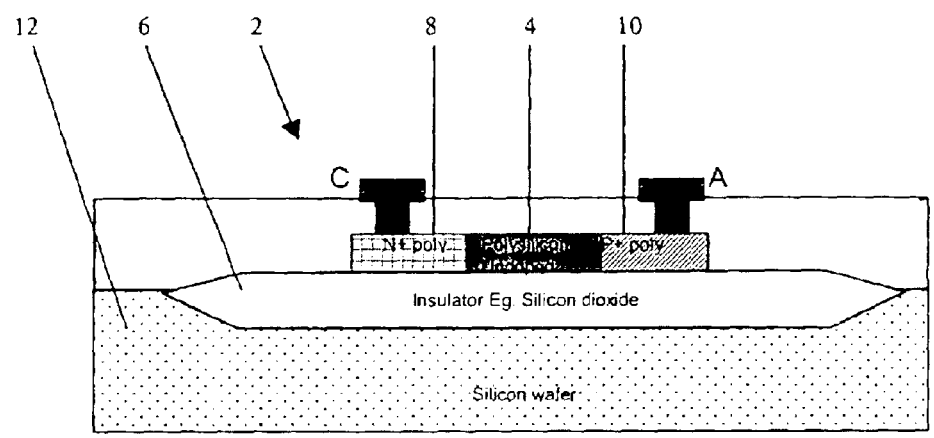
FIG. 1 is a schematic cross-sectional view of an antifuse in accordance with an embodiment of the invention.

An antifuse 2, shown in FIG. 1, is constructed horizontally and is compatible with planar integrated circuit processing. The antifuse 2 is made by cutting a bar of polysilicon material 4 on an insulating layer 6 and doping the ends 8, 10 of it as opposite types (N+ and P+).

Figure 2:
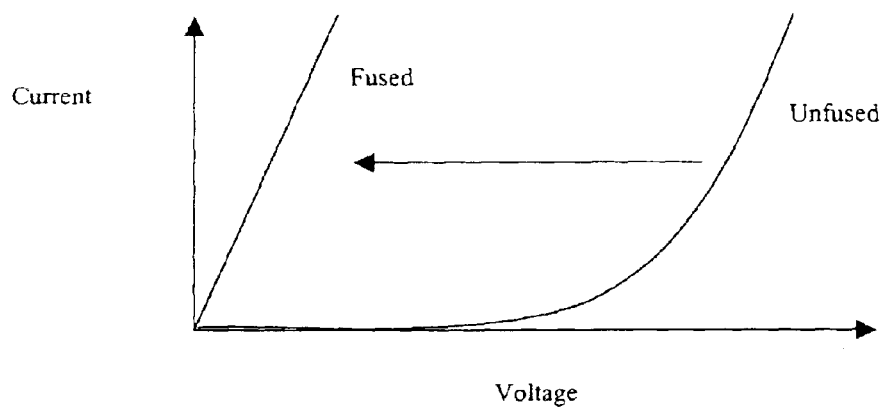
FIG. 2 shows current-voltage curves for the antifuse in fused and unfused states.

Contacts and metallisation (A and C) are made to the doped ends 8, 10 of the bar 4. In its unfused state the component is a semiconductor diode. After applying a moderate current and voltage for a short time in reverse bias the diode fails due to dopant redistribution to form a resistive element; this is the fused state. The voltage required to pass a low current (eg 100 $\mu$A) is significantly lower in the fused state compared to the unfused state, as illustrated in FIG. 2. This difference may be utilised in a number of useful circuits.

The polysilicon antifuse 2 is constructed according to the following sequence:

1. Deposit a layer of undoped polysilicon 4 on an insulating (silicon dioxide) layer 6 on a semiconductor wafer 12.
2. Photo print and etch the polysilicon 4 to the shapes required for antifuses, eg a rectangular bar.
3. Grow or deposit a thin oxide on the polysilicon 4, to prevent implant channeling.
4. Photo print and implant a P+ high dose into one end 10 of the polysilicon 4.
5. Photo print and implant an N+ high dose into the opposite end 8 of the polysilicon 4.
6. Thermally diffuse and electrically activate the dopant with a heat cycle.
7. Form a metal connection to the N+ and P+ doped ends 8, 10 of the component.

These steps are consistent with creating the component within a standard transistor integrated circuit process. Thus the antifuse 2 may be used in conjunction with other circuit elements on a monolithic silicon chip.

At the end of processing the high doping levels diffuse downwards and laterally so that a semiconductor junction diode is formed between the P+ doped and N+ doped regions 10 and 8 respectively. By leaving a small distance between the N+ and P+ doped regions 8, 10 at the photo print stages, the properties of the diode are controlled. Larger separations give a PIN diode with high series resistance. At small separation a degenerate junction may be formed. This changes the reverse breakdown voltage of the device and the leakage between the two connections.

The processing needs to be such as to form a semiconductor diode, which has a low reverse bias leakage and appropriate breakdown voltage between the two connected ends. Implant doping the polysilicon body with a lighter level of N or P dopant can also be used to control the electrical properties of the diode (ie. leakage, resistance and breakdown voltage).

In the unfused state the component 2 forms a diode with a reverse breakdown voltage of a few volts so that it can be fused using voltages that can be passed into the integrated circuit.

The component 2 must have N+ and P+ doped regions 8, 10 in close proximity (eg 0.5 $\mu$m apart) to allow for dopant distribution when a moderate amount (a few milliamps) of current is applied to form a low series resistance when the diode junction is fused, or "blown". To "blow" the device the current needs to be applied in reverse bias for the diode and at a voltage which is above the diode breakdown voltage.

In the fused state, the component diode reverse breakdown voltage no longer exists and instead a resistive short circuit exists between the two connections A and C.

The connections and metallisation to the fuse structure need to be robust enough to pass the required fusing current without causing electromigration or melting failure of the connecting regions.

A diode is created with a moderate reverse breakdown voltage of a few volts. When a current of a few milliamps in reverse bias is passed, the device fails, ie "blows". In the failure mode a resistive short circuit if formed between the two connections A and C. The structure forms a practical antifuse component for use on monolithic integrated circuits.

The device may be fabricated within a modern integrated circuit process.

In general, the spacing between the N+ and P+ regions should be less than about 5 μm. This allows the component to be printed on larger geometry processes and also gives a degree of control of the component resistance, breakdown and leakage current. Diffusion in polysilicon may be rapid and so a greater separation may be required if the device is subjected to higher temperatures through the latter processing stages (eg for other semiconductor processes).

The embodiment described above uses a layer of silicon dioxide to insulate the antifuse from the silicon substrate. However, the antifuse could be produced on different substrates and insulated using different dielectrics. The important thing is electrical insulation from the substrate using a dielectric layer.

What is claimed is:

1. A method of producing an antifuse, comprising the steps of:
   depositing a layer of undoped or lightly doped polysilicon on a layer of insulating material on a semiconductor wafer;
   degeneratively doping one region of the polysilicon P+;
   degeneratively doping another region of the polysilicon N+,
   leaving an undoped or lightly doped region between the P+ and N+ regions; and
   forming electrical connections to the P+ and N+ regions.

2. A method as claimed in claim 1, wherein the polysilicon is elongate in shape.

3. A method as claimed in claim 2, wherein the polysilicon is photo printed and etched into said elongate shape.

4. A method as claimed in claim 2, wherein said P+ and N+ regions are opposite ends of the polysilicon.

5. A method as claimed in claim 1, wherein the spacing between the P+ and N+ regions is less than 5 μm.

6. A method as claimed in claim 4, wherein the spacing between the P+ and N+ regions is less than 5 μm.

7. A method as claimed in claim 5, wherein the spacing between the P+ and N+ regions is about 0.5 μm.

8. A method as claimed in claim 1 which further includes adding a thin dielectric layer to the polysilicon to prevent implant channeling.

9. A method as claimed in claim 8, wherein said thin dielectric layer is silicon dioxide.

10. A method as claimed in claim 1, which further comprises making metal connections to the P+ and N+ regions.

11. A method as claimed in claim 8, which further comprises making metal connections to the P+ and N+ regions.

12. A method as claimed in claim 1, wherein a heat cycle is applied in order to diffuse and electrically activate the dopants.

13. A method as claimed in claim 11, wherein a heat cycle is applied in order to diffuse and electrically activate the dopants.

14. A method as claimed in claim 1, wherein high P+ and N+ doses are photo printed and implanted in order to produce said P+ and N+ regions.

15. A method as claimed in claim 13, wherein high P+ and N+ doses are photo printed and implanted in order to produce said P+ and N+ regions.

16. An antifuse produced by a method as claimed in claim 1.

17. An antifuse produced by a method as claimed in claim 15.

18. A method as claimed in claim 1, in which the insulating material is silicon dioxide.

* * * * *